United States Patent
Kim et al.

(10) Patent No.: US 8,986,555 B2
(45) Date of Patent: Mar. 24, 2015

(54) METHOD OF MANUFACTURING PRINTED CIRCUIT BOARD HAVING BUMP

(75) Inventors: Ji-Eun Kim, Gwangmyung-si (KR); Nam-Keun Oh, Daejeon (KR); Jung-Hyun Park, Hwasung-si (KR); Young-Ji Kim, Daejeon (KR); Jong-Gyu Choi, Choongchungnam-Do (KR); Sang-Duck Kim, Chingjoo-si (KR)

(73) Assignee: Samsung Electro-Mechanics Co., Ltd., Suwon-Si (KR)

( * ) Notice: Subject to any disclaimer, the term of this patent is extended or adjusted under 35 U.S.C. 154(b) by 504 days.

(21) Appl. No.: 12/892,047

(22) Filed: Sep. 28, 2010

(65) Prior Publication Data

US 2011/0100952 A1 May 5, 2011

(30) Foreign Application Priority Data

Oct. 30, 2009 (KR) ........................ 10-2009-0104562

(51) Int. Cl.
*H01B 13/00* (2006.01)
*H05K 3/40* (2006.01)
(Continued)

(52) U.S. Cl.
CPC ............ *H05K 3/4007* (2013.01); *H05K 3/061* (2013.01); *H05K 3/205* (2013.01); *H05K 2201/0367* (2013.01); *H05K 2203/0152* (2013.01); *H05K 2203/0376* (2013.01)
USPC .................. 216/18; 216/13; 216/41; 438/725

(58) Field of Classification Search
CPC . H05K 3/4608; H05K 3/4611; H05K 3/4007; H05K 3/423

USPC ........... 216/13, 14, 16, 18, 19, 20, 41, 17, 33, 216/35, 75; 257/737, 738; 438/612, 725, 438/622
See application file for complete search history.

(56) References Cited

U.S. PATENT DOCUMENTS

2005/0097727 A1 * 5/2005 Iijima et al. .................... 29/729
2008/0053688 A1 * 3/2008 Park et al. ..................... 174/258
(Continued)

FOREIGN PATENT DOCUMENTS

| CN | 101175371 A | 5/2008 |
| CN | 101330071 A | 12/2008 |

(Continued)

OTHER PUBLICATIONS

Korean Office Action issued in Korean Patent Application No. 10-2009-0104562, dated Feb. 18, 2011.
(Continued)

*Primary Examiner* — Lan Vinh
(74) *Attorney, Agent, or Firm* — McDermott Will & Emery LLP (57) ABSTRACT

A method of manufacturing a printed circuit board having a bump is disclosed. The method includes preparing a first carrier having a first circuit formed thereon, compressing the first carrier to one surface of an insulation layer such that the first circuit is buried, stacking an etching resist on the first carrier in accordance with where the bump is to be formed and forming the bump by etching the first carrier. In accordance with an embodiment of the present invention, the difference in height between a bump and its adjacent bump in a printed circuit board can be reduced, and thus electrical connection between an electronic component and the printed circuit board can be better implemented.

4 Claims, 10 Drawing Sheets

(51) Int. Cl.
　　*H05K 3/06*　　(2006.01)
　　*H05K 3/20*　　(2006.01)

(56) References Cited

U.S. PATENT DOCUMENTS

| | | | |
|---|---|---|---|
| 2008/0142964 A1* | 6/2008 | Sun et al. | 257/737 |
| 2008/0296052 A1* | 12/2008 | Inagaki et al. | 174/260 |
| 2008/0303146 A1* | 12/2008 | Wang | 257/737 |
| 2009/0174059 A1* | 7/2009 | Magerlein et al. | 257/692 |

FOREIGN PATENT DOCUMENTS

| | | |
|---|---|---|
| JP | 61-267396 A | 11/1986 |
| JP | 61-267396 A | 11/1986 |
| JP | 11-243157 A | 9/1999 |
| JP | 11-243157 A | 9/1999 |
| JP | 2006-179923 | 7/2006 |
| JP | 2008-112995 A | 5/2008 |
| JP | 2009-004772 A | 1/2009 |
| TW | I222844 | 10/2004 |
| WO | WO 00/76279 A1 | 12/2000 |

OTHER PUBLICATIONS

Japanese Office Action, with partial English translation, issued in Japanese Patent Application No. 2010-118310, dated Jan. 24, 2012.
Chinese Office Action, and English translation thereof, issued in Chinese Patent Application No. 201010178229.6 dated Jun. 19, 2012.
Office Action issued in Chinese Application No. 201010178229.6 dated Mar. 8, 2013.

* cited by examiner

METHOD OF MANUFACTURING PRINTED CIRCUIT BOARD HAVING BUMP

CROSS-REFERENCE TO RELATED APPLICATIONS

This application claims the benefit of Korean Patent Application No. 10-2009-0104562, filed with the Korean Intellectual Property Office on Oct. 30, 2009, the disclosure of which is incorporated herein by reference in its entirety.

BACKGROUND

1. Technical Field

The present invention is related to a method of manufacturing a printed circuit board having a bump.

2. Description of the Related Art

With the development of the electronics industry, integration in semiconductor integrated circuits (IC) is dramatically increased. For example, the earlier applications of a mobile terminal in the mobile communication sector were limited to services such as voice call and SMS message delivery. However, the recent applications of the mobile terminal have gradually been expanded from basic communication services to multimedia services such as games, data transmission, digital photography using a digital camera and music/video file playback. Meanwhile, considering the portability of the mobile terminal performing the functions of mobile communication, reduction in size and weight of the mobile terminal is essentially required.

For the packaging of a semiconductor integrated circuit, formed on an upper surface of a printed circuit board are a bonding pad for connecting an electrode of an electronic component, such as a semiconductor component, and a resin layer that exposes the center portion of the bonding pad. A bump for coupling the electronic component to the bonding pad is formed on the bonding pad exposed from a solder resist.

The electronic component is mounted on the upper surface of the printed circuit board in such a way that each electrode of the electronic component is connected to a respective bump, and then they are heated by using an electric oven. By melting the bumps, the bumps and the electrodes of the electronic component can be coupled to one another so that the electronic component can be mounted on the board.

In one example of forming this kind of bump, solder paste constituted by flux and solder powder can be coated on a bonding pad by way of screen printing and then heated through the use of an electric oven. In this way, the solder powder in the solder paste can be melted so that a bump can be formed on the bonding pad.

In the conventional method for forming a bump, however, the rate of each bump formed can vary due to different temperatures distributed in the board, causing a difference in height between the bumps. Thus, in a printed circuit board, a plurality of bumps may be formed in different size, and thus a bump that has relatively smaller in height than its adjacent bump may not be connected to an electronic component at all.

SUMMARY

The present invention provides a method of manufacturing a printed circuit board having a bump.

An aspect of the present invention provides a method of manufacturing a printed circuit board having a bump. The method in accordance with an embodiment of the present invention includes preparing a first carrier having a first circuit formed thereon, compressing the first carrier to one surface of an insulation layer such that the first circuit is buried, stacking an etching resist on the first carrier in accordance with where the bump is to be formed and forming the bump by etching the first carrier.

The preparing of the first carrier can include forming a first seed layer by electroless plating the first carrier and forming the first circuit by electroplating the first seed layer.

The method can further include, after the preparing of the first carrier, preparing a second carrier having a second circuit formed thereon and compressing the second carrier on the other surface of the insulation layer such that the second circuit is buried, while the first carrier is compressed to one surface thereof.

The forming of the bump can include completely etching the second carrier.

The method can further include, after the forming of the bump, forming a via in the insulation layer such that the first circuit and the second circuit are electrically connected to each other.

Additional aspects and advantages of the present invention will be set forth in part in the description which follows, and in part will be obvious from the description, or may be learned by practice of the invention.

DETAILED DESCRIPTION

As the invention allows for various changes and numerous embodiments, a particular embodiment will be illustrated in the drawings and described in detail in the written description. However, this is not intended to limit the present invention to a particular mode of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various components, such components must not be limited to the above terms. The above terms are used only to distinguish one component from another.

The terms used in the present specification are merely used to describe a particular embodiment, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A method of manufacturing a printed circuit board having a bump in accordance with a certain embodiment of the present invention will be described below in more detail with reference to the accompanying drawings. Those components that are the same or are in correspondence are rendered the same reference numeral regardless of the figure number, and redundant descriptions are omitted.

Figure 1:
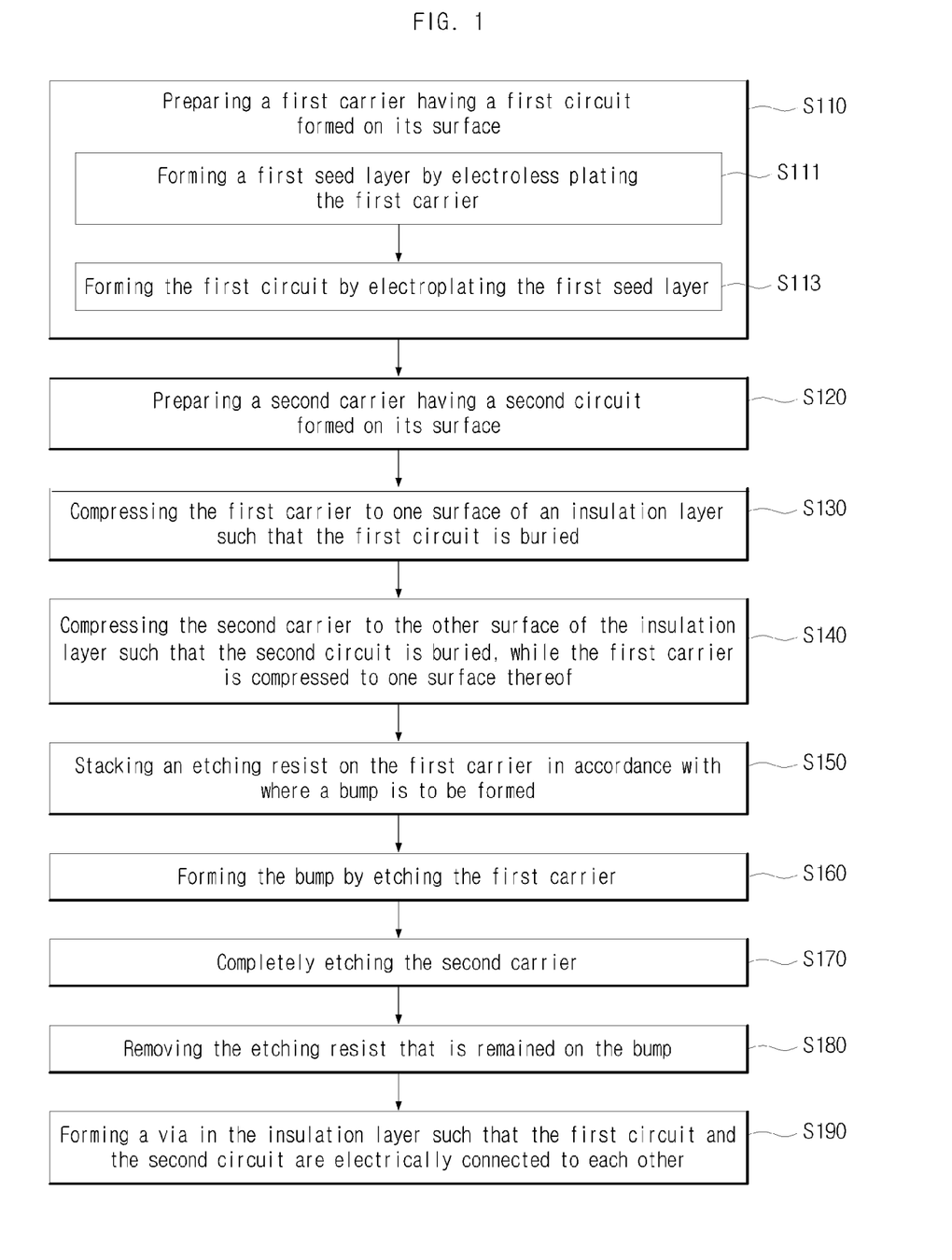
FIG. 1 is a flowchart illustrating a method of manufacturing a printed circuit board having a bump in accordance with an embodiment of the present invention.

FIG. 1 is a flowchart illustrating a method of manufacturing a printed circuit board having a bump in accordance with an embodiment of the present invention, and FIGS. 2 to 10 are cross-sectional views illustrating the method of manufacturing a printed circuit board having a bump in accordance with an embodiment of the present invention.

In this embodiment, firstly, a first carrier 110 having a first circuit 115 formed thereon is prepared (S110). For this, a first seed layer 113 can be formed by electroless plating the first carrier 110 (S111), and then the first circuit 115 can be formed by electroplating the first seed layer 113 (S113). Then, in order to form a multilayered circuit, a second carrier 120 having a second circuit 125 formed on its surface can be prepared (S120). Here, the second carrier 120 can be formed by electroless plating a second seed layer 123 on the second carrier 120 and then electroplating the second circuit 125 on the second seed layer 123.

The carriers 110 and 120 can be metal layers, for example, copper thin layers. A common carrier is used for carrying a circuit and the like during a process of manufacturing a printed circuit board. Unlike the common carrier, the first carrier 110 in accordance with an embodiment of the present invention not only carries the first circuit 115 to an insulation layer 130 but also is formed as a bump 110' through a manufacturing process, which will be described later. In the present embodiment, the first carrier 110 can be used as the bump 110' so that no additional solder paste or metal that is required to manufacture a common bump may be used, thereby saving the production cost.

Figure 2:
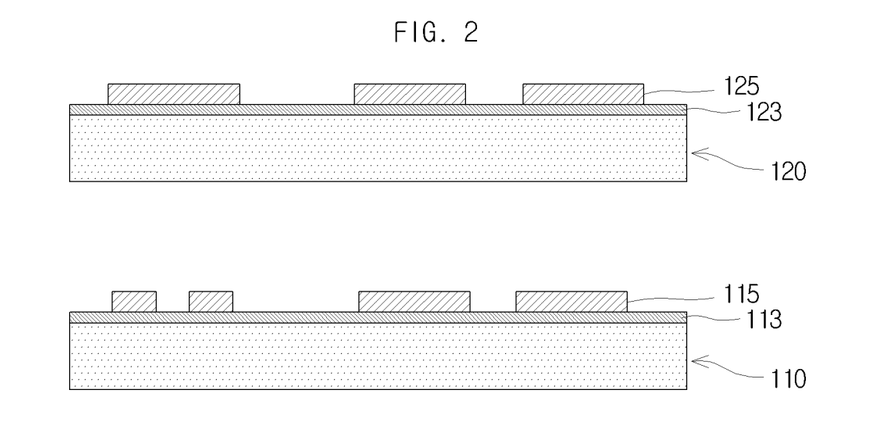
FIGS. 2 to 10 are cross-sectional views illustrating a method of manufacturing a printed circuit board having a bump in accordance with an embodiment of the present invention.
Figure 3:
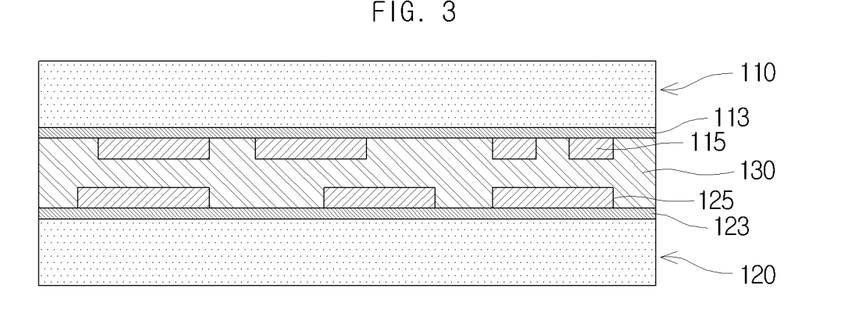

Through the above processes, once the carriers 110 and 120 having the circuits 115 and 125 formed thereon are prepared, as illustrated in FIG. 2, the first carrier 110 is compressed to one surface of the insulation layer 130 such that the first circuit 115 is buried, as illustrated in FIG. 3 (S130), and at the same time, the second carrier 120 is compressed to the other surface of the insulation layer 130 such that the second circuit 125 is buried (S140). In one example, the insulation layer 130, such as semisolid prepreg, can be stacked on an upper side of the second carrier 120, and the first carrier 110 can be stacked on an upper side of the insulation layer 130. Then, the second carrier 120 and the first carrier 110 are compressed together until the insulation layer 130 is hardened.

Figure 4:
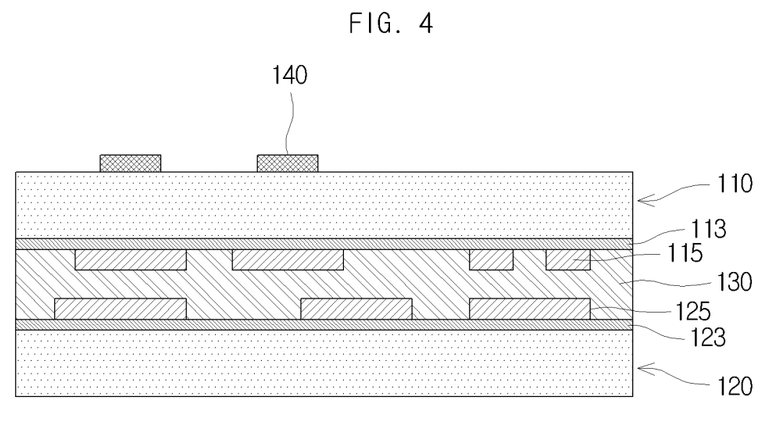

Next, an etching resist 140 is stacked on the first carrier 110 in accordance with where the bump 110' is to be formed (S150). For this, the etching resist 140 can be formed on the first carrier 110 by adhering a photosensitive film, such as a dry film, to the first carrier 110 and then exposing and developing the photosensitive film. This is illustrated in FIG. 4.

Figure 5:
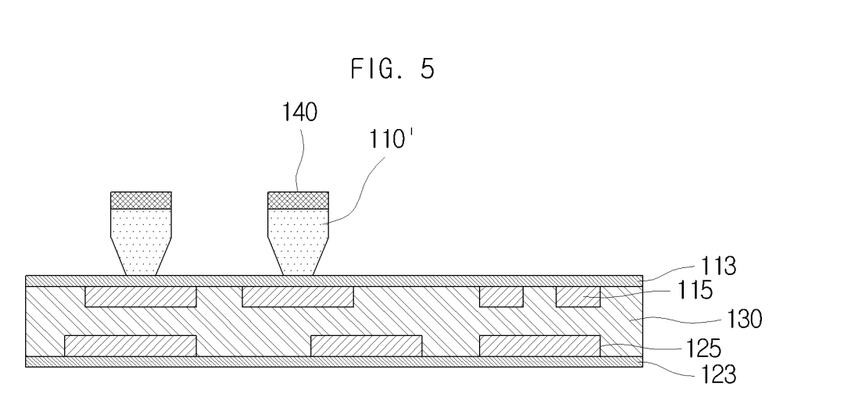

Next, the bump 110' is formed by etching the first carrier 110 (S160). While the first carrier 110 is etched, the second carrier 120 is completely etched (S170). In one example, the first carrier 110 and the second carrier 120 can be copper thin layers, and the first seed layer 113 and the second seed layer 123 can be nickel layers. In this case, since the carriers 110 and 120 are made of a material that is different from that of the seed layers 113 and 123, they can be etched using a different etching solution. In this way, while the carriers 110 and 120 are etched, the seed layers 113 and 123 can function as an etching preventing barrier that prevents the circuits 115 and 125 from being etched. As a result, the bump 110' can be formed on the upper side of the insulation layer 130, as illustrated in FIG. 5.

Figure 6:
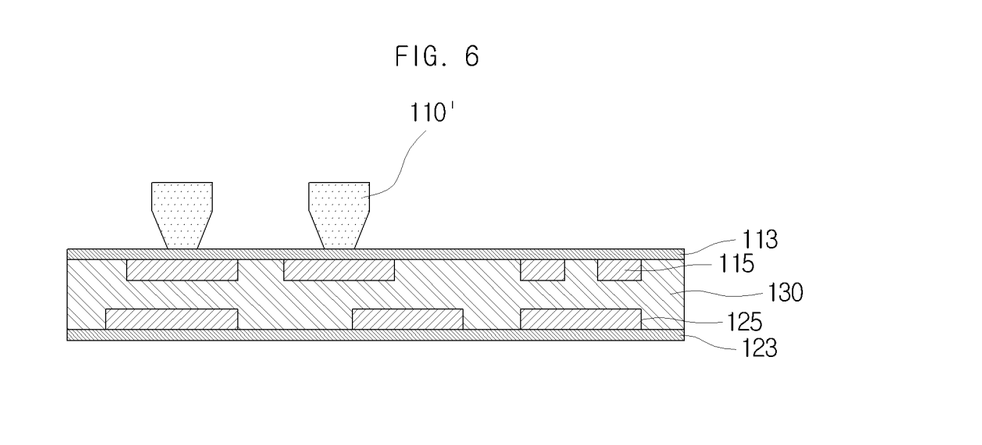
Figure 7:
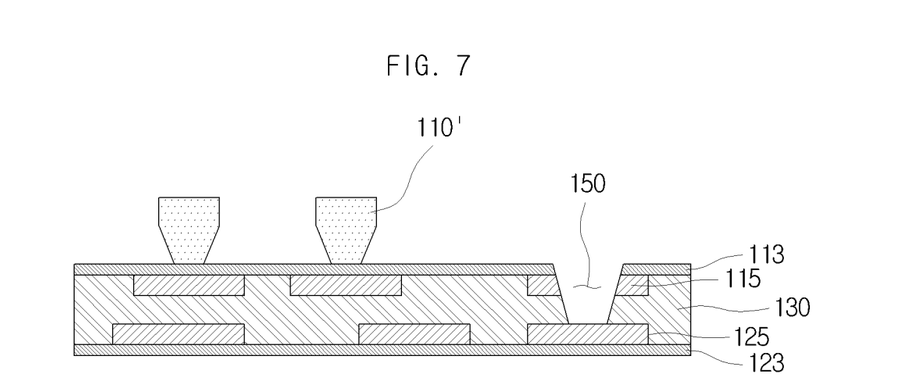

Next, as illustrated in FIG. 6, the etching resist 140 that is remained on the bump 110' is removed (S180), and then, as illustrated in FIG. 7, a via hole 150 is formed in the insulation layer 130 by way of laser processing in such a way that the first circuit 115 and the second circuit 125 are electrically connected to each other (S190).

Figure 8:
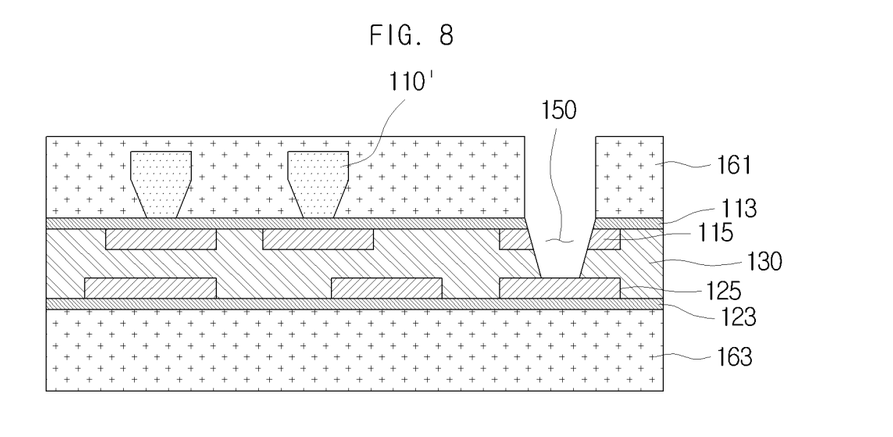
Figure 9:
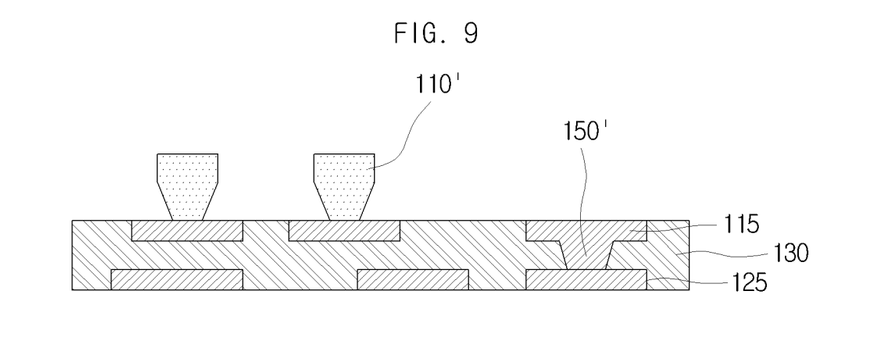

Once the via hole 150 is formed, photosensitive films, such as dry films 161 and 163, can be laminated, excluding the area of the via hole 150, in such a way that only the via hole 150 is plated or filled with a metallic substance. In one example, as illustrated in FIG. 8, the dry films 161 and 163 in which a hole is formed corresponding to the location of the via hole 150 are laminated to the seed layers 113 and 123. The dry films 161 and 163 function to prevent plating from being formed. That is, as illustrated in FIG. 9, plating, such as the reference numeral 150', is formed in the via hole 150 only and becomes a via 150' that will be electrically connected, and no plating is formed on the seed layers 113 and 123 and the bump 110'.

Then, the dry films 161 and 163 can be removed, and the seed layers 113 and 123 can be etched. In one example, the seed layers 113 and 123 made of a material including nickel can be etched by using an etching solution, without damaging the circuits 115 and 125 and the bump 110'. Etching the seed layers 113 and 123 can be performed by way of flashing etching.

Figure 10:
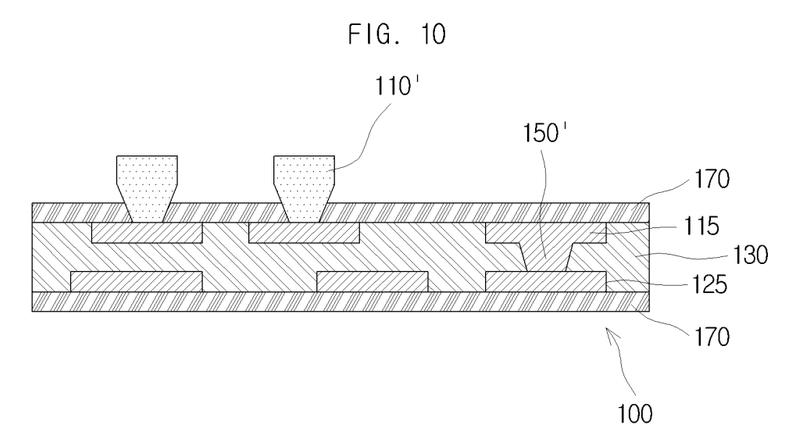

Next, a solder resist 170 is stacked on an upper side and a lower side of the insulation layer 130. As illustrated in FIG. 10, the solder resist 170 protects the insulation layer 130 and the circuits 115 and 125 by forming a film on the outside, excluding the bump 110', which is a connection part.

In this method of manufacturing the printed circuit board 100 having a bump, the bump 110' is formed by using the first carrier 110 having a certain thickness, and thus a plurality of bumps 110' with uniform height can be implemented. Therefore, if the plurality of bump 110' are mounted on a mother board or electronic component, every bump 110' can be in full contact with the mother board or electronic component, thereby facilitating easier connection to a printed circuit board.

According to an embodiment of the present invention, the difference in height between neighboring bumps in a printed circuit board can be reduced, and thus bumps that are lower in height than neighboring bumps can be prevented from being formed. Therefore, electrical connection between an electronic component and the printed circuit board can be better implemented.

While the spirit of the present invention has been described in detail with reference to a particular embodiment, the embodiment is for illustrative purposes only and shall not limit the present invention. It is to be appreciated that those skilled in the art can change or modify the embodiment without departing from the scope and spirit of the present invention.

As such, many embodiments other than that set forth above can be found in the appended claims.

What is claimed is:
1. A method of manufacturing a printed circuit board having a bump, the method comprising:
preparing a first carrier having a first circuit formed thereon, the first carrier comprising a metal;
preparing a second carrier having a second circuit formed thereon, the second carrier comprising a metal;
compressing the first carrier and the second carrier against one surface and the other surface of an insulation layer, respectively, such that the first circuit and the second circuit are buried;

stacking an etching resist on the first carrier in accordance with where the bump is to be formed;

forming the bump by etching the first carrier; and forming a via in the insulation layer such that the first circuit and the second circuit are electrically connected to each other, wherein the bump comprises a metal and is electrically connected to the first circuit.

2. The method of claim 1, wherein the preparing of the first carrier comprises:

forming a first seed layer by electroless plating the first carrier; and forming the first circuit by electroplating the first seed layer.

3. The method of claim 1, wherein the forming of the bump comprises completely etching the second carrier.

4. The method of claim 1, wherein the via is formed after the bump is formed.

* * * * *